United States Patent [19]

Nitta et al.

[11] Patent Number: 5,789,265
[45] Date of Patent: Aug. 4, 1998

[54] METHOD OF MANUFACTURING BLUE LIGHT-EMITTING DEVICE BY USING BCL3 AND CL2

[75] Inventors: Koichi Nitta, Yokohama; Sumio Ishimatsu, Machida, both of Japan

[73] Assignee: Kabushiki Kaisha Toshiba, Kawasaki, Japan

[21] Appl. No.: 799,634

[22] Filed: Feb. 12, 1997

Related U.S. Application Data

[63] Continuation of Ser. No. 697,594, Aug. 27, 1996, abandoned.

[30] Foreign Application Priority Data

Aug. 31, 1995 [JP] Japan ................... 7-223896

[51] Int. Cl.⁶ .................................................. H01L 1/00
[52] U.S. Cl. ........................... 437/228 PE; 437/129; 437/126; 437/133; 156/655.1
[58] Field of Search .................... 438/42, 46, 47

[56] References Cited

U.S. PATENT DOCUMENTS

| | | | |
|---|---|---|---|
| 5,030,590 | 7/1991 | Amini et al. | 437/228 |
| 5,247,533 | 9/1993 | Okazaki et al. | 372/45 |
| 5,273,933 | 12/1993 | Hatamo et al. | 437/127 |
| 5,316,979 | 5/1994 | MacDonald et al. | 437/228 |

FOREIGN PATENT DOCUMENTS

| | | |
|---|---|---|
| 1-278025 | 11/1989 | Japan . |
| 1-278026 | 11/1989 | Japan . |
| 5-63236 | 3/1993 | Japan . |

*Primary Examiner*—Charles L. Bowers, Jr.
*Assistant Examiner*—Keith Christianson
*Attorney, Agent, or Firm*—Finnegan, Henderson, Farabow, Garrett & Dunner, L.L.P.

[57] ABSTRACT

A method of manufacturing blue light-emitting device is disclosed wherein a laminated structure comprising a p-type $In_xAl_yGa_{1-x-y}N$ layer and an n-type $In_xAl_yGa_{1-x-y}N$ layer are etched selectively by virtue of a parallel plate type plasma etching (RIE) using etching gas including boron trichloride ($BCl_3$) and chlorine ($Cl_2$).

28 Claims, 7 Drawing Sheets

METHOD OF MANUFACTURING BLUE LIGHT-EMITTING DEVICE BY USING BCL3 AND CL2

This application is a continuation of application Ser. No. 08/697,594, filed Aug. 27, 1996, now abandoned.

BACKGROUND OF THE INVENTION

1. Field of the Invention

The present invention relates to a method of manufacturing a blue light-emitting device employing a gallium nitride (GaN)-based III -V compound semiconductor and, more particularly, dry etching technique used for the GaN-based III -V compound semiconductor.

2. Description of the Prior Art

In recent years, a GaN-based compound semiconductor such as GaN, $In_xGa_{1-x}N$, or $Ga_xAl_{1-x}N$ attracts attention as material for a blue light-emitting diode (LED) or a blue semiconductor laser diode (LD). With the use of this compound semiconductor (III -V nitride), it has been possible to achieve the LED and the LD for emitting a blue light, which has been difficult to assure sufficiently high luminous intensity up to this day.

As the blue light-emitting device using the GaN-based III -V compound semiconductor, an LED has been set forth in Patent Application Publication (KOKAI) 5-63236, for example. A structure of the LED in the prior art is shown in FIG. 1. More particularly, a blue LED 2 consists of an n-type GaN semiconductor layer 202 and a p-type GaN semiconductor layer 203, both being laminated on a sapphire ($Al_2O_3$) substrate 100 via a buffer layer 201. The blue light can be emitted by injecting carriers into a pn-junction formed between the n-type GaN semiconductor layer 202 and the p-type GaN semiconductor layer 203. In order to manufacture such blue LED, first the sapphire substrate 100 is prepared, then respective semiconductor layers 201, 202, 203 formed of gallium nitrides are laminated on the sapphire substrate 100 by MO-CVD method, etc., then the laminated substrate is taken out from a growth chamber of the epitaxial growth apparatus, then laminated gallium nitride semiconductor layers are subjected to necessary etching, and finally the resultant laminated substrate is cut out to be separated into individual chips of an appropriate size.

The GaN-based III -V compound semiconductor is considerably chemically stable and thus insoluble in acid such as hydrochloric acid, sulfuric acid, hydrofluoric acid, or their mixed solution. It is therefore impossible to carry out wet etching on such compound semiconductor in the existing circumstance. For this reason, dry etching process must be needed to etch such compound semiconductor. Such dry etching process have been set forth in Patent Application Publications (KOKAIs) 1-278025 and 1-278026. In these Official Gazettes, there have been proposed dry etching processes using carbon tetrachloride ($CCl_4$) gas and dichlorodifluoromethane ($CCl_2F_2$) gas. However, dichlorodifluoromethane ($CCl_2F_2$) is one of the origin of "the green house effect" causing the global warming and under control of production and consumption of CFC (chlorofluorocarbon) gas. Therefore, handling of exhaust gas of such dichlorodifluoromethane (Freon 12), etc. is troublesome and thus particular consideration should be taken to employ such gas. In the meanwhile, if carbon tetrachloride ($CCl_4$) is used, the foregoing problem does not occur but another problem would arise, i.e., etching rate of carbon tetrachloride ($CCl_4$) is very slow rather than dichlorodifluoromethane ($CCl_2F_2$), which leads to low productivity of the device. In addition, still another problem would arise to the effect that, since carbon tetrachloride ($CCl_4$) exists in the form of liquid at the room temperature, pressure and flow rate are difficult to be kept constant, which needs very troublesome treatment.

SUMMARY OF THE INVENTION

Therefore, an object of the present invention is to provide a dry etching method for a GaN-based compound semiconductor, which is easy to be carried out and has wide applicability.

Another object of the present invention is to provide a manufacturing method capable of accomplishing a GaN-based blue light-emitting device of high quality with high manufacturing yield, based on the above dry etching method for the GaN-based compound semiconductor.

In order to attain the above objects, the dry etching method according to the present invention uses etching gas including boron trichloride ($BCl_3$) and chlorine ($Cl_2$).

The method of manufacturing the blue light-emitting device according to the present invention comprises at least the steps of forming a laminated structure which includes a first GaN-based semiconductor layer of first conductivity type, a substantially intrinsic GaN-based semiconductor active layer, and a second GaN-based semiconductor layer of second conductivity type which is opposite to the first conductivity type, and etching the laminated structure up to a predetermined depth by means of etching gas including boron trichloride and chlorine. The term "substantially intrinsic" means that impurity is not doped intentionally.

With the above structure, according to the present invention, the dry etching process which is applicable in wide fields of semiconductor can be achieved without using CFC etching gas which is a subject in the controlling of production and consumption.

Furthermore, with the above structure, the blue LED, etc. of high-performance can be simply manufactured with high manufacturing yield.

Other and further objects and features of the present invention will be become obvious upon an understanding of the illustrative embodiments about to be described in connection with the accompanying drawings or will be indicated in the appended claims, and various advantages not referred to herein will occur to one skilled in the art upon employing of the invention in practice.

DETAILED DESCRIPTION OF THE EMBODIMENTS

Figure 1:
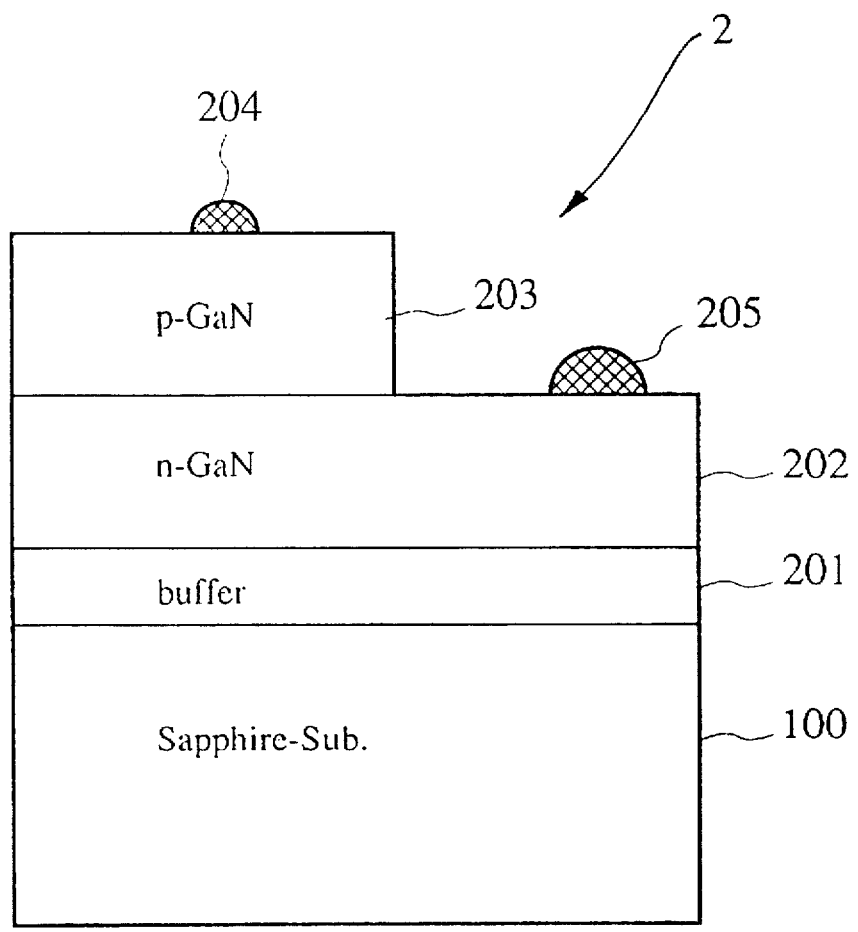
FIG. 1 is a schematic sectional view showing a layer structure of a semiconductor chip of a GaN-based compound semiconductor blue LED in the prior art.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. Generally and as it is conventional in the representation of semiconductor light emitting devices, it will be appreciated that the various drawings are not drawn to scale from one figure to another nor inside a given figure, and in particular that the layer thickness are arbitrarily drawn for facilitating the reading of the drawings.

Figure 2:
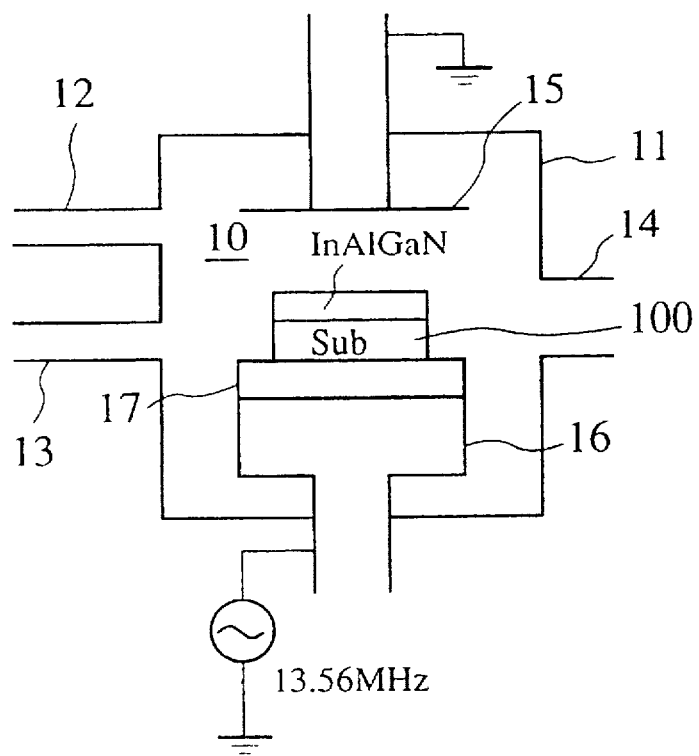
FIG. 2 is a schematic view showing a structure of an etching apparatus for use in dry etching process according to the present invention.

In the first place, a method of etching a GaN-based semiconductor according to the present invention will be explained with reference to FIG. 2. FIG. 2 is a schematic side view showing a structure of a parallel plate type plasma etching apparatus, or a reactive ion etching (RIE) apparatus capable of carrying out dry etching process according to the present invention. The plasma etching (RIE) apparatus 10 comprises a vacuum chamber 11, a first reaction gas introducing pipe 12, a second reaction gas introducing pipe 13, an exhausting pipe 14, a first electrode 15, a second electrode 16, and a quartz plate 17 loaded on the second electrode 16. The quartz plate 17 serves as an electrode cover which isolates an etching sample from the second electrode 16 and prevents the etching sample from being contaminated by heavy metals sputtered out from the second electrode 16. In FIG. 2, the etching sample, i.e., a sapphire substrate 100 on a surface of which a laminated structure of the GaN-based semiconductors is formed, is placed on the quartz plate 17. An interior of the vacuum chamber 11 is then exhausted to the extent of about $1 \times 10^{-2}$ Pa. Boron trichloride $BCl_3$ is then introduced at 50 sccm via the first reaction gas introducing pipe 12 and simultaneously chlorine $Cl_2$ is introduced at 5 sccm via the second reaction gas introducing pipe 13. At that time, high frequency (RF) power of 13.58 MHz is supplied to the second electrode 16. Thus plasma and reaction species such as radicals are generated in the vacuum chamber 11, so that the plasma etching apparatus 10 is ready for dry etching of the laminated structure of the GaN-based semiconductors. During dry etching process, reaction pressure is kept at 1 Pa and substrate temperature is kept at 5° C. The reaction pressure may be controlled by a conductance adjusting valve such as a butterfly valve connected between the exhausting pipe 14 and a vacuum pump such as an oil-sealed rotary pump or a mechanical booster pump. As will be explained later, reasons for keeping the substrate temperature at 5° C. are that dry-etching durability of photo-resist as a mask material used for selective etching must be maintained and that quality change of the photo-resist due to high temperature must be prevented, or it may become difficult to peel the photo-resist from the surface of the material to be etched.

Figure 3A:
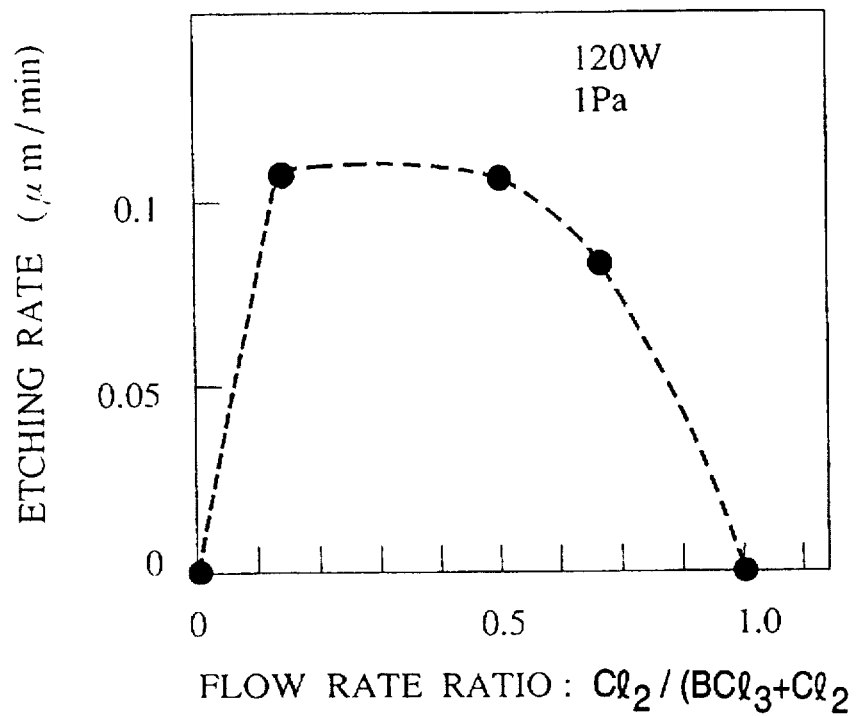
FIGS. 3A to 3E are views illustrating respectively dependence of etching rate on flow rate of gas, etching pressure, RF output power, and the like in dry etching process according to the present invention.

First, change in etching rate will be explained depending on changing flow rate ratio of boron trichloride ($BCl_3$) supplied via the first reaction gas introducing pipe 12 and chlorine ($Cl_2$) supplied via the second reaction gas introducing pipe 13. In the case of the n-type GaN-based semiconductor, etching effect would be expected to some degree when only boron trichloride $BCl_3$ is used. Nevertheless, these two etching gases are indispensable to etch other GaN-based semiconductors, especially the p-type GaN-based semiconductor. The examined results of change in the etching rate of the p-type GaN-based semiconductor is shown in FIG. 3A if flow rate ratio of $BCl_3$ and $Cl_2$ is changed variously at the etching pressure of 1 Pa and the RF output of 120 W. As evident from FIG. 3A, only when the flow rate ratio $Cl_2/(Cl_2+BCl_3)$ is in the range of 0.02 to 0.8, high etching rate can be achieved to thus exhibit the effect of dry etching. In more detail, it can be understood that the expected effect of dry etching can be attained if $Cl_2$ is included in the reaction gas more than 1 %. This is because both reactivity of $Cl_2$ and sputtering of $BCl_3$ seem to be required synergistically to etch the p-type GaN-based semiconductor.

Figure 3B:
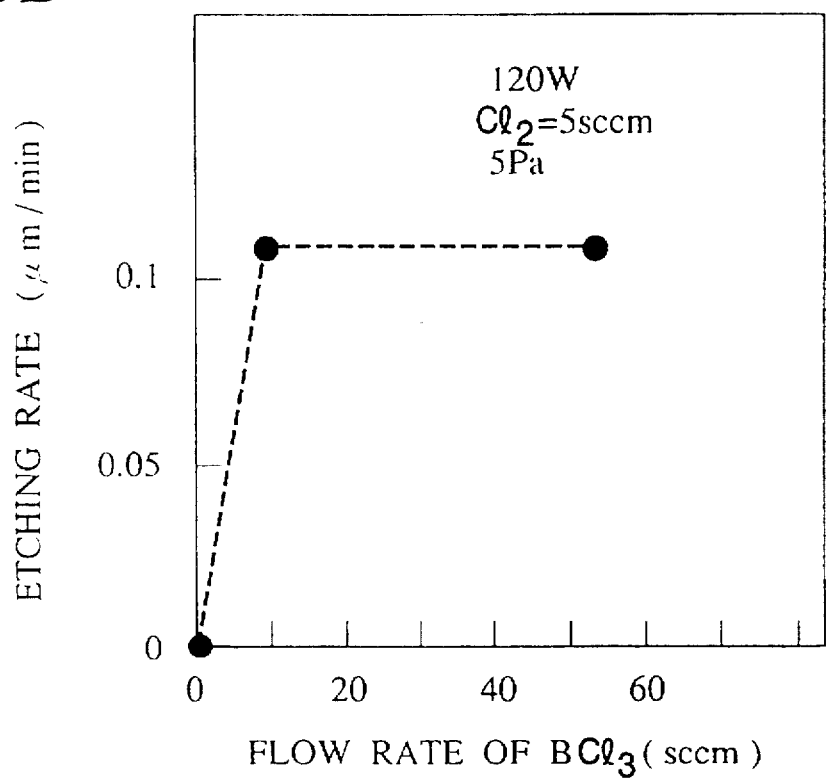
Figure 3C:
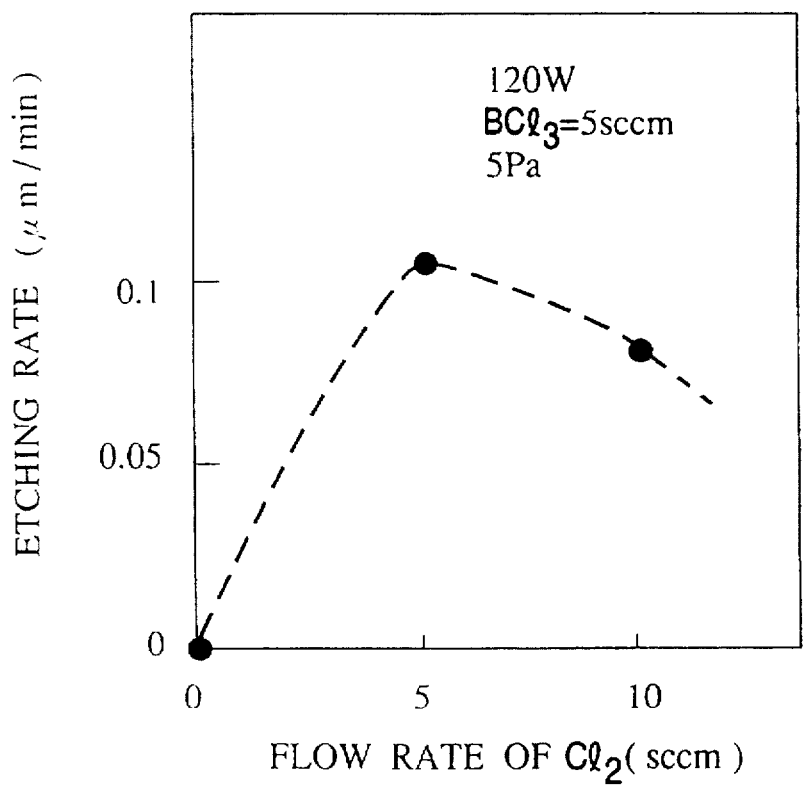
Figure 3D:
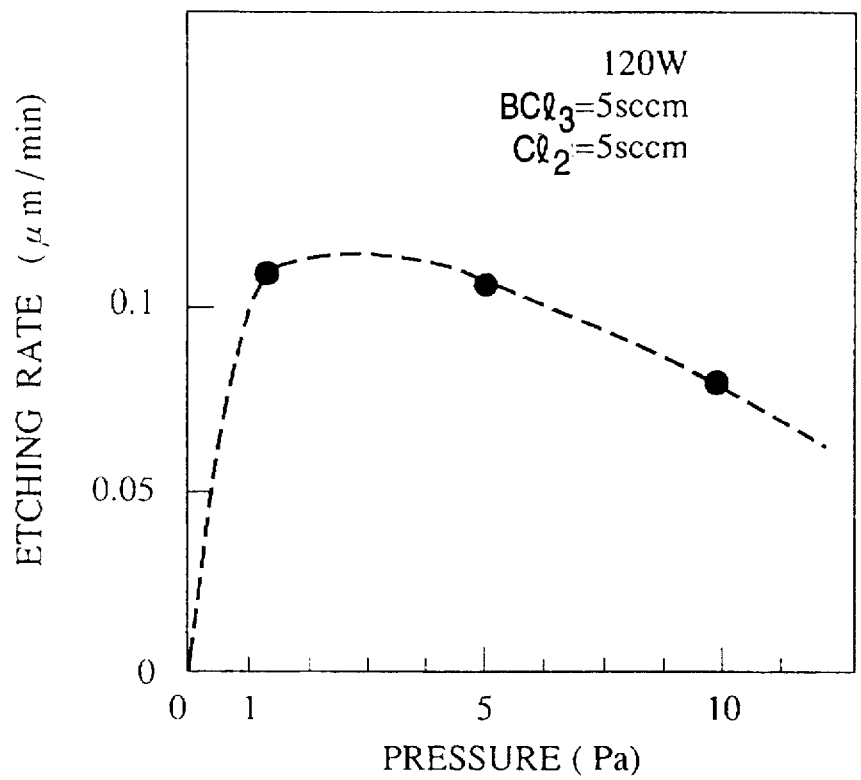
Figure 3E:
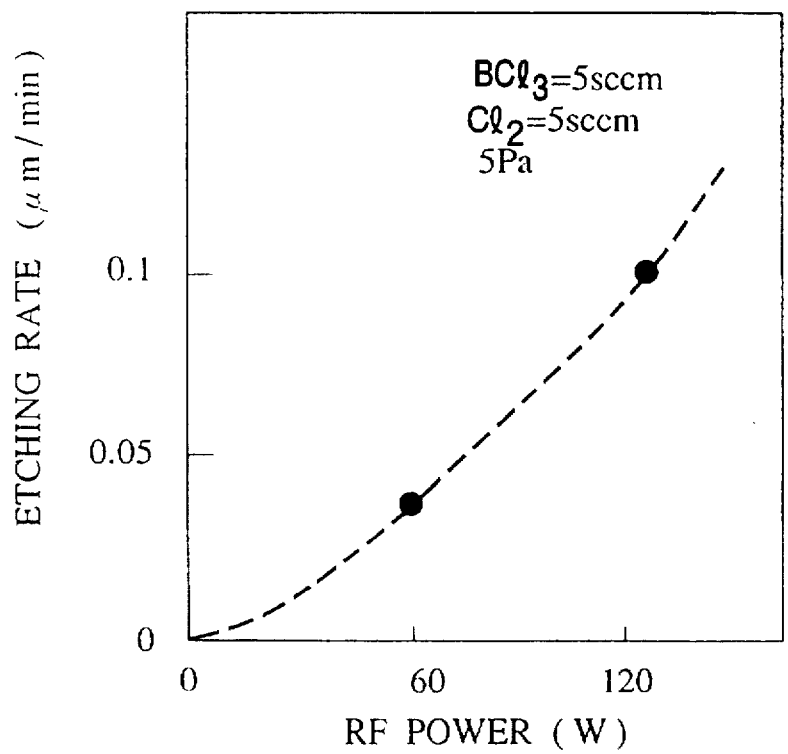

FIG. 3B is a view illustrating dependence of etching rate of the p-type GaN-based semiconductor on flow rate of $BCl_3$ if the flow rate of $Cl_2$ is kept constant at 5 sccm under the conditions that the etching pressure is 5 Pa and the RF output is 120 W. It would be apparent that almost constant etching rate can be derived if $BCl_3$ is in excess of 10 sccm. FIG. 3C is a view illustrating dependence of etching rate of the p-type GaN-based semiconductor on flow rate of $Cl_2$ if the flow rate of $BCl_3$ is kept constant at 5 sccm under the conditions that the etching pressure is 5 Pa and the RF output is 120 W. It would be appreciated from FIG. 3C that the etching rate may assume its maximum value near the flow rate of $Cl_2$ of 5 sccm and then decrease gradually. FIG. 3D is a view illustrating the measured result of dependence of etching rate of the p-type GaN-based semiconductor on etching pressure, i.e., pressure in the vacuum chamber 11 under the conditions that the RF output is 120 W, the flow rate of $BCl_3$ is 5 sccm, and the flow rate of $Cl_2$ is 5 sccm. It would be evident from FIG. 3D that the etching rate may assume its almost maximum value at the etching pressure of 1 Pa and it decreases gradually if the etching pressure is increased further more. FIG. 3E is a view illustrating dependence of etching rate of the p-type GaN-based semiconductor on RF output power, i.e., RF power applied between the first electrode 15 and the second electrode 16 under the conditions that the etching pressure is 5 Pa, the flow rate of $BCl_3$ is 5 sccm, and the flow rate of $Cl_2$ is 5 sccm. It can be understood from FIG. 3E that the etching rate is increased substantially in proportion to the RF output. In the higher range of the etching rate among the conditions shown in FIGS. 3A to 3E, etching rates of p-type GaN, n-type GaN, p-type $In_xGa_{1-x}N$, n-type $In_xGa_{1-x}N$, p-type $In_xAl_yGa_{1-x-y}N$, n-type $In_xAl_yGa_{1-x-y}N$ and $SiO_2$ are set mutually to the substantially same degree.

As has been explained, a dry etching method which is applicable in wide fields of semiconductor, especially GaN-based compound semiconductor, can be achieved by the plasma etching using $BCl_3$ and $Cl_2$ without using CFC etching gas that is under the controlling of production and consumption. The etching rate can be sufficiently increased and productivity can also be enhanced. With taking account of the above, in the present invention, flow rate of $BCl_3$ of 50 sccm, flow rate of $Cl_2$ of 5 sccm, etching pressure of 1 Pa and RF output of 120 W are selected as optimum etching conditions for the GaN-based semiconductors. According to the plasma etching in compliance with these conditions, the U-shaped trench having less under cut and substantially vertical side walls can be formed, and damages to the semiconductor substrate during etching can also be lessened.

Next, a method of manufacturing the GaN-based compound semiconductor blue LED according to the present invention by means of the above dry etching (RIE) technique will be explained with reference to FIGS. 4, 5, and 6A to 6E.

Figure 4:
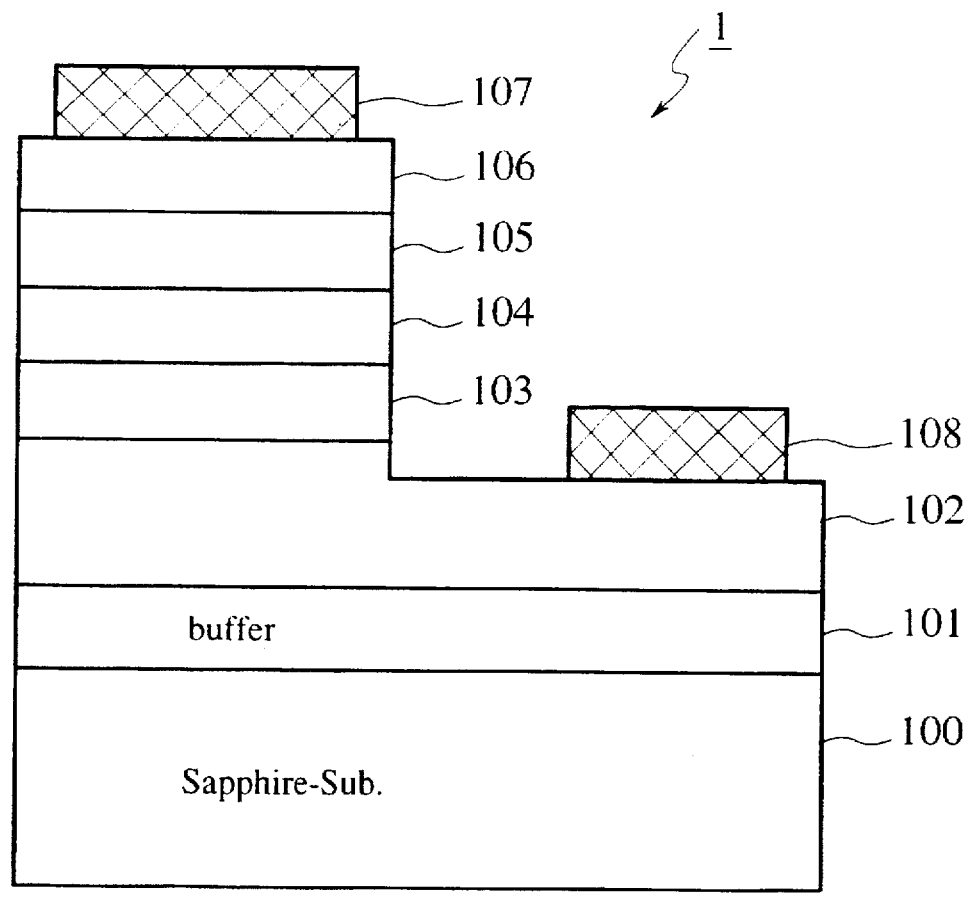
FIG. 4 is a sectional view showing a layer structure of a semiconductor chip of a GaN-based compound semiconductor blue LED according to the present invention.

FIG. 4 is a sectional view showing a GaN-based compound semiconductor blue LED 1 according to the manufacturing method of the present invention immediately before an assembling step. As shown in FIG. 4, on the sapphire substrate 100 are formed in order an n-type GaN-based semiconductor buffer layer 101, an n-type GaN-based semiconductor contact layer 102, an n-type GaN-based semiconductor cladding layer 103, a GaN-based semiconductor active layer 104, a p-type GaN-based semiconductor cladding layer 105, a p-type GaN-based semiconductor contact layer 106, an n side electrode 108 connected to the n-type GaN-based semiconductor contact layer 102, and a p side electrode 107 connected to the p-type GaN-based semiconductor cladding layer 105. The n side electrode 108 is formed on the bottom of a trench. The trench is formed from a surface of the p-type GaN-based semiconductor contact layer 106 to the n-type GaN-based semiconductor contact layer 102 through the p-type GaN-based semiconductor cladding layer 105, the GaN-based semiconductor active layer 104 and the n-type GaN-based semiconductor cladding layer 103, so as to expose the n-type GaN-based semiconductor contact layer 102 and to make ohmic contact with the n-type GaN-based semiconductor contact layer 102. More particularly, $In_xAl_yGa_{1-x-y}N$ compound semiconductor is adopted as the GaN-based semiconductors which are used in the layers 101 to 106. This is because the blue light can be emitted in a wide range by adjusting mole fraction values x, y. Where mole fraction values x, y satisfy $0 \leq x \leq 1$, $0 \leq y \leq 1$ and $x+y \leq 1$.

The n-type GaN-based semiconductor buffer layer 101 is provided to relax lattice mismatching between the n-type GaN-based semiconductor contact layer 102 and the sapphire substrate 100. For example, mole fraction values of $In_xAl_yGa_{1-x-y}N$ are selected respectively to be $0 \leq x \leq 1$, $0 \leq y \leq 1$, preferably $0 \leq x \leq 0.5$, $0.5 \leq y \leq 1$. The n-type GaN-based semiconductor contact layer 102 is provided to make good ohmic contact with the n side electrode 108. In the case of the n-type GaN-based semiconductor contact layer 102, respective mole fraction values of $In_xAl_yGa_{1-x-y}N$ are selected to be $0 \leq x \leq 1$, $0 \leq y \leq 1$, preferably $0 \leq x \leq 0.3$, $0 \leq y \leq 0.3$, for instance. In order to obtain n-type conductivity, an impurity such as silicon (Si) or selenium (Se) is used as a dopant. Impurity concentration is of $6 \times 10^{18}$ cm$^{-3}$. The n-type GaN-based semiconductor cladding layer 103 constitutes an n side of pin junction serving as a light emitting region. Depending upon luminous wavelength to be generated, respective mole fraction values of $In_xAl_yGa_{1-x-y}N$ used as the n-type GaN-based semiconductor cladding layer 103 may be adjusted appropriately. For example, the mole fraction values are selected to be $0 \leq x \leq 1$, $0 \leq y \leq 1$, preferably $0 \leq x \leq 0.3$, $0.1 \leq y \leq 1$. In order to obtain n-type conductivity, an impurity such as Si or Se is also used as a dopant. Impurity concentration is set to $3 \times 10^{18}$ cm$^{-3}$. The GaN-based semiconductor active layer 104 constitutes a central region of the light emitting region, in which impurity is not doped intentionally, i.e., which is substantially intrinsic semiconductor layer. Respective mole fraction values of $In_xAl_yGa_{1-x-y}N$ used as the active layer 104 may be adjusted appropriately correspondingly to luminous wavelength to be generated. For example, the mole fraction values are selected to be $0 \leq x \leq 1$, preferably $0 \leq x \leq 0.6$, $0 \leq y \leq 0.5$. The p-type GaN-based semiconductor cladding layer 105 constitutes a p side of the pin junction serving as the light emitting region. In connection with the n-type GaN-based semiconductor cladding layer 103, and the GaN-based semiconductor active layer 104, respective mole fraction values of $In_xAl_yGa_{1-x-y}N$ used in the p-type semiconductor cladding layer 105 may be adjusted suitably in compliance with luminous wavelength to be generated. For instance, the mole fraction values are selected to be $0 \leq x \leq 1$, $0 \leq y \leq 1$, preferably $0 \leq x \leq 0.3$, $0.1 \leq y \leq 1.0$. In order to achieve p-type conductivity, an impurity such as magnesium (Mg), beryllium (Be) or zinc (Zn) is used as a dopant. Impurity concentration is of $3 \times 10^{18}$ cm$^{-3}$. The p-type GaN-based semiconductor contact layer 106 is formed to provide a low resistivity surface layer just under a p side electrode 107, thereby obtaining low ohmic contact resistance. The mole fraction values of $In_xAl_yGa_{1-x-y}N$ used in the p-type semiconductor contact layer 106 are selected respectively to be $0 \leq x \leq 1$, $0 \leq y \leq 1$, preferably $0 \leq x \leq 0.3$, $0 \leq y \leq 0.3$, for example. In order to have p-type conductivity, an impurity such as Mg, Be or Zn is also used as a dopant. Impurity concentration is set to $8 \times 10^{18}$ cm$^{-3}$.

The p side electrode 107 is an electrode which is transparent to a light emitted from the GaN-based semiconductor active layer 104. In particular, although this electrode is formed of a compound of metal and oxygen like ITO (indium tin oxide), it may also be formed of a sufficiently thin metal such as Al or Ni. The n side electrode 108 is another electrode which is not always transparent to the light. For instance, this electrode may be formed of metal such as Ti, Al, or Ni.

In the foregoing explanation, the mole fraction values of $In_xAl_yGa_{1-x-y}N$ are determined respectively such that bandgaps of the n-type GaN-based semiconductor cladding layer 103 and the p-type GaN-based semiconductor cladding layer 105 become large rather than that of the GaN-based semiconductor active layer 104. According to the above structure, an amount of carriers which are to be injected into the GaN-based semiconductor active layer 104 can be increased, and therefore luminance intensity may be further improved.

Next, a method of manufacturing the blue-LED shown in FIG. 4 will be explained with reference to FIG. 5 and FIGS. 6A to 6E hereinbelow.

Figure 5:
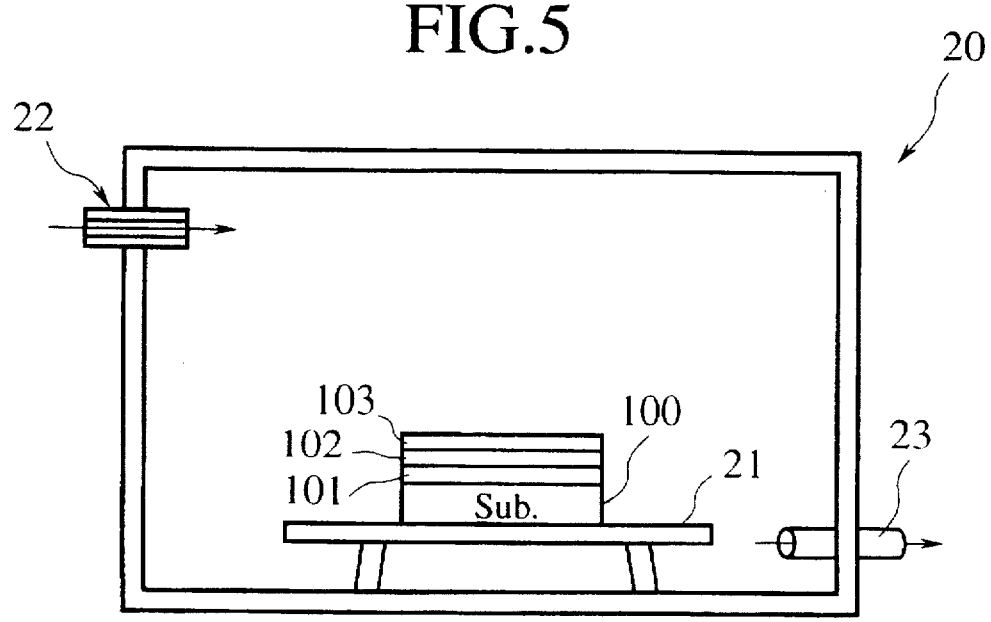
FIG. 5 is a schematic sectional view showing a structure of a CVD apparatus for the epitaxial growth of the GaN-based compound semiconductor to manufacture the blue LED according to the present invention in a simplified manner.
Figure 6A:
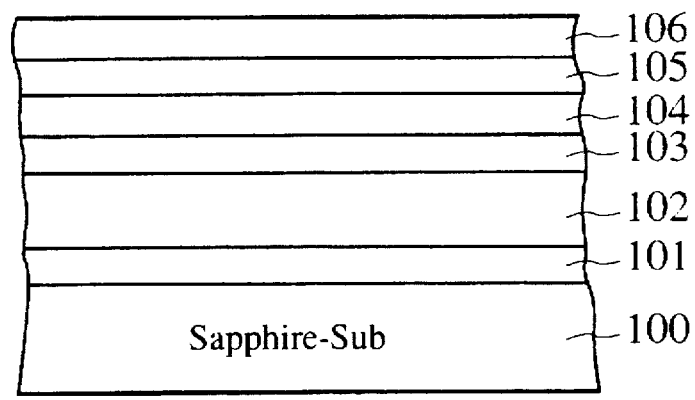
FIGS. 6A to 6E are sectional views illustrating manufacturing steps in a method of manufacturing the semiconductor chip of the GaN-based compound semiconductor blue LED according to the present invention.

(a) As shown in FIG. 6A, on the (0001) sapphire substrate 100 are laminated by metalorganic chemical vapor deposition (MO-CVD), halide CVD, molecular-beam epitaxy (MBE) or the like in sequence the n-type $In_xAl_yGa_{1-x-y}N$ buffer layer 101, the n-type $In_xAl_yGa_{1-x-y}N$ contact layer 102, the n-type $In_xAl_yGa_{1-x-y}N$ cladding layer 103, the non-doped $In_xAl_yGa_{1-x-y}N$ active layer 104, the p-type $In_xAl_yGa_{1-x-y}N$ cladding layer 105, and the p-type $In_xAl_yGa_{1-x-y}N$ contact layer 106. For instance, the n-type cladding layer 103 is 0.1 μm thick, the non-doped active layer 104 is 0.2 μm thick, the p-type cladding layer 105 is 0.5 μm thick, and the p-type contact layer 106 is 0.1 μm thick. In FIG. 5, an example of the MO-CVD apparatus for use in growing the above layers in sequence is exemplified in a simplified manner. As the MO-CVD apparatus, a high frequency (RF) induction heating type atmospheric pressure CVD (AP-CVD) furnace is used which comprises a growth chamber 20, a substrate holder 21 provided in the growth chamber 20, a reaction gas introducing pipe 22, an exhausting pipe 23, and a water cooled high frequency coil for heating the substrate placed in the substrate holder 21. For purposes of simplicity, the high frequency coil may be omitted in FIG. 5. According to the sequential epitaxial growth steps by the MO-CVD apparatus shown in FIG. 5, first the (0001) sapphire substrate 100 is loaded on the substrate holder 21 and then the inside of the growth chamber 20 is evacuated up to $10^{-2}$ to $10^{-5}$ Pa. After this, the sapphire substrate 100 is heated by high frequency induction heating, and then reaction gas including organic metal is introduced in the growth chamber 20 while keeping the sapphire substrate 100 at a predetermined temperature. For example, trimethylgallium (Ga(CH$_3$)$_3$), trimethylindium (In(CH$_3$)$_3$), trimethylaluminium (Al(CH$_3$)3), ammonia (NH$_3$), and the like may be used as the reaction gas at the substrate temperature of 850° C. to 1050° C. These material gas are introduced into the growth chamber 20 together with the carrier gas such as hydrogen or nitrogen. Growth pressure is about 1 atm (100 kPa). In this manner, continuous growth of GaN-based semiconductors is effected from the buffer layer 101 to the contact layer 106. At that time, component ratios of respective layers can be controlled by changing respective component rates in the reaction gas. In addition, monosilane (SiH$_4$), biscyclopentadienylmagnesium (Cp$_2$Mg), etc. are introduced appropriately in order to dope impurity into the semiconductor layers.

Figure 6B:
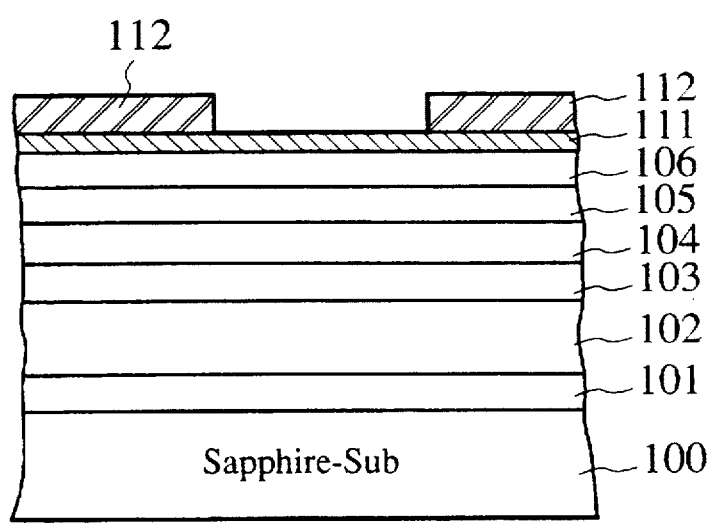

(b) Next, the sapphire substrate 100 on which the buffer layer 101 to the contact layer 106 are laminated in sequence is taken out from the CVD furnace. Then, an oxide film (SiO$_2$ film) 111 is formed on the p-type In$_x$Al$_y$Ga$_{1-x-x}$N contact layer 106 as the etching mask by sputtering method, CVD method, or the like. Any one of plasma CVD method, photo-excited CVD method, and thermal CVD method may be used as the CVD method to form the SiO$_2$ film. As shown in FIG. 6B, the photoresist 112 formed on the oxide film 111 is patterned by means of predetermined photolithography technique. For purposes of example, positive resist such as polymethylmethacrylate (PMMA), or AZ-1350J may be used as the photoresist. For instance, a thickness of the oxide film is set to 300 nm and a thickness of the photoresist is set to 3 μm.

Figure 6C:
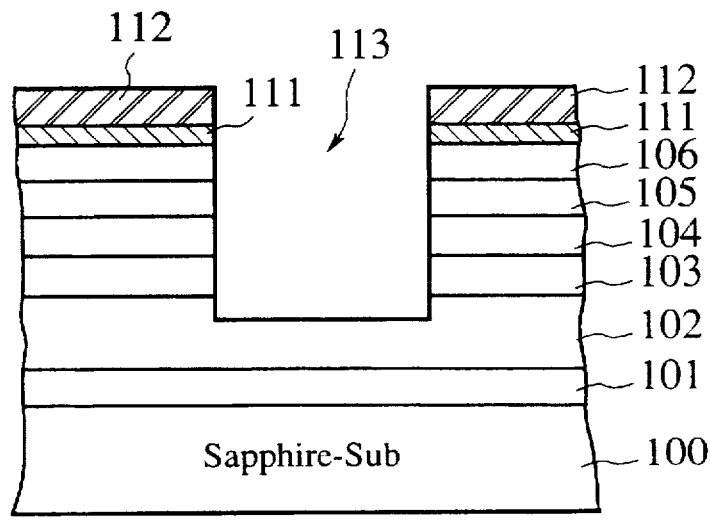

(c) As shown in FIG. 6C, with the use of the two-layered mask consisting of the photoresist 112 and the oxide film 111 as the plasma etching mask, the p-type contact layer 106, the p-type cladding layer 105, the non-doped active layer 104, and the n-type cladding layer 103 are etched to form the U-shaped trench 113 of 1.2 μm in depth and to expose the n-type contact layer 102 by the parallel plate type plasma etching using Cl$_2$ and BCl$_3$. A part of the n-type contact layer 102 may be etched still more. Under the conditions of the flow rate of BCl$_3$ of 50 sccm, the flow rate of Cl$_2$ of 5 sccm, the etching pressure of 1 Pa, and the RF output of 120 W, this plasma etching may be carried out for ten minutes.

Figure 6D:
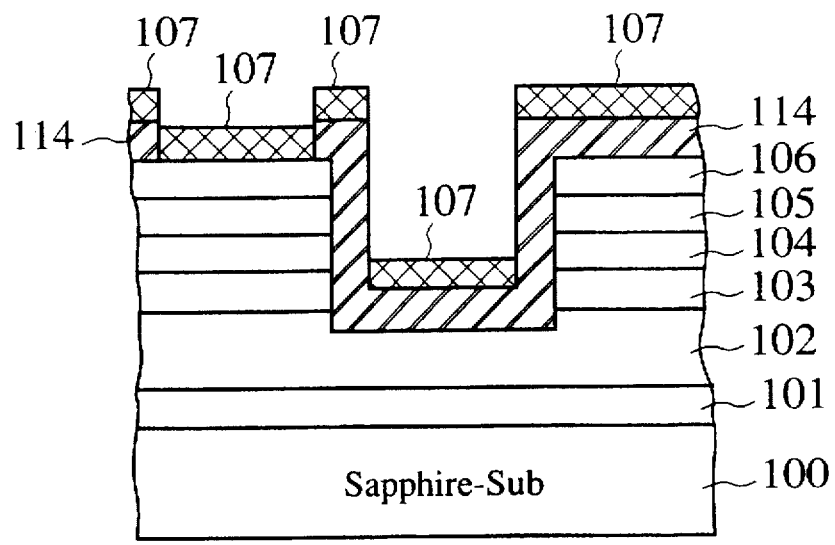

(d) The photoresist 112 used as the plasma etching mask is removed by sodium hydroxide (NaOH) solution, then the oxide film 111 is removed by buffered hydrogen fluoride (HF) solution, and then the substrate is cleaned. The p-type contact layer 106 is then subjected to predetermined slight etching. An ITO film to be used as a p side electrode 107 is then formed on the p-type contact layer 106 by the CVD method or the sputtering method. The p side electrode 107 is patterned by a so-called "lift-off" method. In other words, prior to deposition of the ITO film 107, the semiconductor layer is covered with the photoresist 114 except for the areas which is to be contacted to the ITO film 107. As shown in FIG. 6D, the ITO film 107 is then deposited. After this, if the photoresist 114 is removed, patterns of the p side electrode 107 are formed only on the p-type contact layer 106.

Figure 6E:
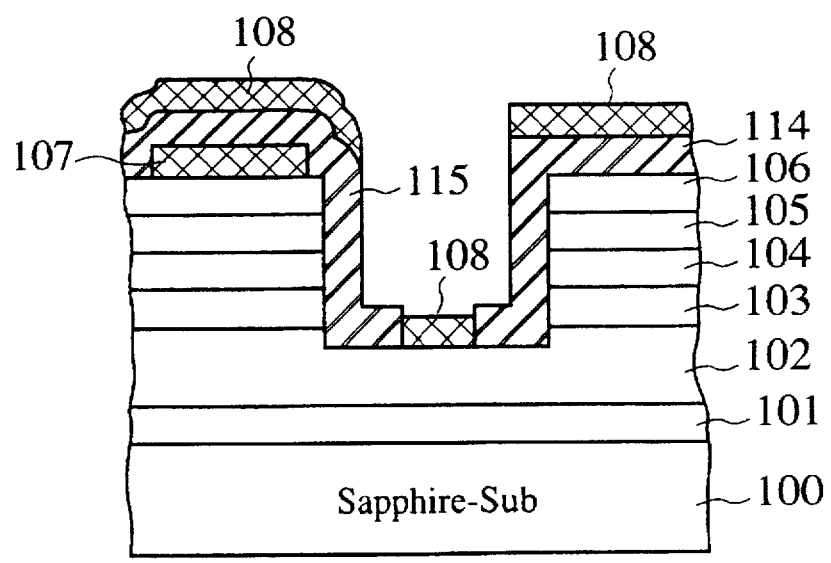

(e) Subsequently, as shown in FIG. 6E, an n side electrode 108 is formed on the bottom of the U-shaped trench.

The n side electrode 108 is also formed by the lift-off method. More particularly, the semiconductor layer region other than n side electrode 108 forming regions is covered with the photoresist 115. Metal material 108 such as Ti, Al, or Ni is then deposited on the semiconductor layer by sputtering method or vacuum evaporation method. The photoresist 115 is then removed. As a result, the n side electrode 108 resides only on the bottom of the U-shaped trench (see FIG. 4).

(f) After a basic structure of the blue-LED is implemented in this manner, a dicing step is effected. In detail, the resultant device is cut off by diamond cutter along scribing line areas formed in advance by mesa-etching thereon. Consequently, a large number of chips of appropriate size can be obtained. These chips are then mounted respectively on predetermined stems (wire frames) to be wire-bonded and then molded. At this time, the blue-emitting LED of the present invention can be finished.

Although omitted in the above explanation, mesa-etching for forming the scribing line areas used in the dicing step should be carried out prior to the etching step of the U-shaped trench 113 explained in the above (b) and (c). In other words, an SiO$_2$ film is deposited immediately after continuous epitaxy in the above (a), and the laminated structure is etched via a two-layered mask composed of the SiO$_2$ film and the photoresist such as AZ-1350J by virtue of the dry etching process using BCl$_3$ and Cl$_2$. This is because, when the substrate on which the laminated structure of GaN-based semiconductors is cut off into a large number of chips, characteristics of the semiconductors located in neighboring areas of the cut off portions are badly influenced by the cut-off and therefore grooves used to cut off are formed previously on the laminated structure of GaN-based semiconductors to prevent such bad influence. This mesa etching is applied commonly to overall mesa type LEDs. However, sufficient mesa etching has not been applied to the GaN-based semiconductor in the prior art yet. In the present invention, part of the n-type GaN-based semiconductor cladding layer 103, the GaN-based semiconductor active layer 104, the p-type GaN-based semiconductor cladding layer 105, and the p-type GaN-based semiconductor contact layer 106 can be removed along the scribing line areas to be cut readily and precisely by plasma etching. After this, the photoresist and the SiO$_2$ film are removed and a surface of the substrate is then rinsed, and then CVD of the SiO$_2$ film 111 is effected, as explained in the above (b). After all, in the event that mesa etching is carried out by dry etching, the SiO$_2$ film has to be formed twice.

According to plasma etching using BCl$_3$+Cl$_2$ mixed gas of the present invention, contact resistance of the n-type contact layer 102 serving as an etching surface can be achieved on the order of $10^{-4}$ to $10^{-5}$ $\Omega$cm$^2$, which is smaller by one digit to two digits than the contact resistance of the ordinarily grown contact layer. As reasons for this fact, it may be considered that the n-type contact layer is less damaged by the plasma etching according to the present invention and carrier density on the etching surface is increased because vacancies of nitrogen contributing to n-type carriers are formed in etching. Accordingly, as mentioned above, the blue light-emitting device can be obtained according to the present invention.

Various modifications will become possible for those skilled in the art after receiving the teachings of the present disclosure without departing from the scope thereof. Although the blue light LED has been discussed in the above explanation, products of the blue light LD can be obtained with high efficiency and high manufacturing yield in the manner similar to the above.

What is claimed is:

1. A method of manufacturing a blue light emitting device, comprising the steps of:
   (a) forming a laminated structure including a first cladding layer made of a first conductivity type gallium nitride based semiconductor, an active layer made of substantially intrinsic gallium nitride based semiconductor, and a second cladding layer made of a second conductivity type gallium nitride based semiconductor which has opposite conductivity to said first conductivity type; and
   (b) etching said second cladding layer and said active layer by etching gas including boron trichloride and chlorine.

2. The method of claim 1, wherein boron trichloride and chlorine are included more than 20% respectively in said etching gas.

3. The method of claim 1, wherein said etching is carried out by plasma discharge caused by high-frequency power.

4. The method of claim 1, wherein said first cladding layer is formed of n-type $In_xAl_yGa_{1-x-y}N$ compound semiconductor, said active layer is formed of intrinsic $In_xAl_yGa_{1-x-y}N$ compound semiconductor, and said second cladding layer is formed of p-type $In_xAl_yGa_{1-x-y}N$ compound semiconductor.

5. The method of claim 1, comprising the additional step of:
   laminating a buffer layer formed of a first conductivity type gallium nitride based semiconductor on a sapphire substrate prior to said step of forming said laminated structure,
   wherein mole fraction values x, y are selected respectively as $0 \leq x \leq 0.5$, $0.5 \leq y \leq 1$ in said buffer layer, $0 \leq x \leq 0.3$, $0.1 \leq y \leq 1$ in said first cladding layer, $0 \leq x \leq 0.6$, $0y \leq 0.5$ in said active layer, and $0 \leq x \leq 0.3$, $0.1 \leq y \leq 1.0$ in said second cladding layer.

6. The method of claim 3, wherein said etching is parallel plate type plasma etching.

7. The method of claim 6, wherein said etching is selective etching using two-layered mask consisting of an oxide film and a photoresist as a etching mask.

8. The method of claim 7, wherein a U-shaped trench having substantially vertical side walls is formed by said selective etching.

9. The method of claim 1, comprising the additional step of:
   forming an electrode on a bottom of said U-shaped trench formed by said selective etching after said step of selective etching.

10. A method of manufacturing a blue light emitting device, comprising the steps of:
    (a) forming a laminated structure including a first cladding layer made of a first conductivity type gallium nitride based semiconductor, an active layer made of substantially intrinsic gallium nitride based semiconductor, and a second cladding layer made of a second conductivity type gallium nitride based semiconductor which has opposite conductivity to said first conductivity type;
    (b) forming a first etching mask on said second cladding layer;
    (c) etching at least part of said laminated structure using said first etching mask by etching gas including boron trichloride and chlorine (first dry etching step);
    (d) forming a second etching mask on said second cladding layer after removing said first etching mask; and
    (e) etching said second cladding layer and said active layer using said second etching mask (second dry etching step).

11. The method of claim 10, wherein said first etching mask is a two-layered mask consisting of an oxide film and a photoresist.

12. The method of claim 10, wherein said second etching mask is a two-layered mask consisting of an oxide film and a photoresist.

13. The method of claim 10, wherein said first and second dry etching steps are plasma etching using a parallel plate type plasma etching apparatus.

14. The method of claim 10, comprising the additional step of:
    etching part of said first cladding layer using said second etching mask in succession to said second dry etching step.

15. The method of claim 10, comprising the additional step of:
    forming a first electrode layer on part of said first cladding layer after said step of etching said first cladding layer.

16. The method of claim 15, further comprising the step of:
    forming a second electrode layer on part of said second cladding layer.

17. The method of claim 10, wherein said first cladding layer is formed of n-type $In_xAl_yGa_{1-x-y}N$ compound semiconductor, said active layer is formed of intrinsic $In_xAl_yGa_{1-x-y}N$ compound semiconductor, and said second cladding layer is formed of p-type $In_xAl_yGa_{1-x-y}N$ compound semiconductor.

18. The method of claim 10, comprising the additional step of:
    laminating a buffer layer formed of a first conductivity type gallium nitride based semiconductor on a sapphire substrate prior to said step of forming said laminated structure,
    wherein mole fraction values x, y are selected respectively as $0 \leq x \leq 0.5$, $0.55 \leq y \leq 1$ in said buffer layer, $0 \leq x \leq 0.3$, $0.1 \leq y \leq 1$ in said first cladding layer, $0 \leq x \leq 0.6$, $0 \leq y \leq 0.5$ in said active layer, and $0 \leq x \leq 0.3$, $0.1 \leq y \leq 1.0$ in said second cladding layer.

19. A method of manufacturing a light emitting device, comprising the steps of:
    (a) forming a laminated structure including a first cladding layer made of an n-type gallium nitride based semiconductor, an active layer made of substantially intrinsic gallium nitride based semiconductor, and a second cladding layer made of a p-type gallium nitride based semiconductor; and
    (b) etching said second cladding layer by etching gas including boron trichloride ($BCl_3$) and chlorine ($Cl_2$).

20. The method of claim 19, the flow rate ratio $Cl_2/(Cl_2+BCl_3)$ is in the range of 0.02 to 0.8 in said etching gas.

21. The method of claim 19, wherein said etching is carried out by plasma discharge caused by high-frequency power.

22. The method of claim 19, wherein said first cladding layer is formed of $In_xAl_yGa_{1-x-y}N$ compound semiconductor, said active layer is formed of intrinsic $In_xAl_yGa_{1-x-y}N$ compound semiconductor, and said second cladding layer is formed of $In_xAl_yGa_{1-x-y}N$ compound semiconductor.

23. The method of claim 19, comprising the additional step of:

laminating a buffer layer formed of an n-type gallium nitride based semiconductor on a sapphire substrate prior to said step of forming said laminated structure.

24. The method of claim 21, wherein said etching is parallel plate type plasma etching.

25. The method of claim 24, wherein said etching is selective etching using two-layered mask consisting of an oxide film and a photoresist as an etching mask.

26. The method of claim 25, wherein a U-shaped trench having substantially vertical side walls is formed by said selective etching.

27. The method of claim 26, comprising the additional step of:

forming an electrode on a bottom of said U-shaped trench.

28. The method of claim 22, wherein mole fraction values x, y are selected respectively as $0 \leq x \leq 0.5$, $0.5 \leq y \leq 1$ in said buffer layer, $0 \leq x \leq 0.3$, $0.1 \leq y \leq 1$ in said first cladding layer, $0 \leq x \leq 0.6$, $0 \leq y \leq 0.5$ in said active layer, and $0 \leq x \leq 0.3$, $0.1 \leq y \leq 1.0$ in said second cladding layer.

* * * * *

UNITED STATES PATENT AND TRADEMARK OFFICE
CERTIFICATE OF CORRECTION

PATENT NO. : 5,789,265
DATED : August 4, 1998
INVENTOR(S) : Koichi Nitta, et. al.

It is certified that error appears in the above-identified patent and that said Letters Patent is hereby corrected as shown below:

Title page, item [54], and col. 1, lines 2 & 3 "BCL3" should read --$BCL_3$--; and line 3, "CL2" should read --$CL_2$--.

Claim 5, column 9, line 37, "0y≦0.5" should read --$0 \leqq y \leqq 0.5$--.

Claim 18, column 10, line 41, "0.55≦y≦1" should read --$0.5 \leqq y \leqq 1$--.

Signed and Sealed this

Twenty-fourth Day of August, 1999

Attest:

Q. TODD DICKINSON

*Attesting Officer*   *Acting Commissioner of Patents and Trademarks*